US010134906B2

United States Patent
Miyanaga et al.

(10) Patent No.: US 10,134,906 B2
(45) Date of Patent: *Nov. 20, 2018

(54) DISPLAY DEVICE

(71) Applicant: JAPAN DISPLAY INC., Minato-ku (JP)

(72) Inventors: Naoki Miyanaga, Tokyo (JP); Tetsuya Iizuka, Tokyo (JP); Masanori Ando, Tokyo (JP)

(73) Assignee: JAPAN DISPLAY INC., Minato-ku (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/808,266

(22) Filed: Nov. 9, 2017

(65) Prior Publication Data
US 2018/0069130 A1 Mar. 8, 2018

Related U.S. Application Data

(63) Continuation of application No. 15/359,244, filed on Nov. 22, 2016, now Pat. No. 9,847,426, which is a (Continued)

(30) Foreign Application Priority Data

Dec. 6, 2013 (JP) ................................ 2013-252950

(51) Int. Cl.
*H01L 27/14* (2006.01)
*H01L 29/786* (2006.01)
(Continued)

(52) U.S. Cl.
CPC .. *H01L 29/78633* (2013.01); *G02F 1/136209* (2013.01); *G02F 1/136213* (2013.01);
(Continued)

(58) Field of Classification Search
CPC .......... H01L 27/1214; H01L 27/14623; H01L 27/14818; H01L 27/3272; H01L 29/78633
(Continued)

(56) References Cited

U.S. PATENT DOCUMENTS 9,136,281 B2 * 9/2015 Miyanaga ........... H01L 27/1222
9,543,326 B2 * 1/2017 Miyanaga ........... H01L 27/1222
9,847,426 B2 * 12/2017 Miyanaga ......... H01L 29/78633

FOREIGN PATENT DOCUMENTS

CN 1460882 A 12/2003
CN 102193253 A 9/2011
(Continued)

OTHER PUBLICATIONS

Combined Office Action and Search Report dated Apr. 1, 2017 in Chinese Patent Application No. 201410728357.1 (with English translation).

*Primary Examiner* — Tan N Tran
(74) *Attorney, Agent, or Firm* — Oblon, McClelland, Maier & Neustadt, L.L.P.

(57) ABSTRACT

According to one embodiment, a display device includes a first light shielding layer, a second light shielding layer, a first semiconductor layer, a second semiconductor layer, a gate line, a first source line, a second source line, a switching element, and a pixel electrode, wherein an area in which the first light shielding layer and the pixel electrode are opposed to each other and an area in which the second light shielding layer and the pixel electrode are opposed to each other are equal in size.

18 Claims, 4 Drawing Sheets

Related U.S. Application Data continuation of application No. 14/817,921, filed on Aug. 4, 2015, now Pat. No. 9,543,326, which is a continuation of application No. 14/560,350, filed on Dec. 4, 2014, now Pat. No. 9,136,281.

(51) Int. Cl.
*H01L 27/12* (2006.01)
*G02F 1/1362* (2006.01)

(52) U.S. Cl.
CPC ...... *G02F 1/136286* (2013.01); *H01L 27/124* (2013.01); *H01L 27/1222* (2013.01)

(58) Field of Classification Search
USPC ............................................ 257/59, 72, 432
See application file for complete search history.

(56) References Cited

FOREIGN PATENT DOCUMENTS

| | | |
|---|---|---|
| CN | 102346339 A | 2/2012 |
| JP | 2008-26773 A | 2/2008 |
| JP | 2010-072067 | 4/2010 |
| KR | 10-2007-0108689 A | 11/2007 |

\* cited by examiner

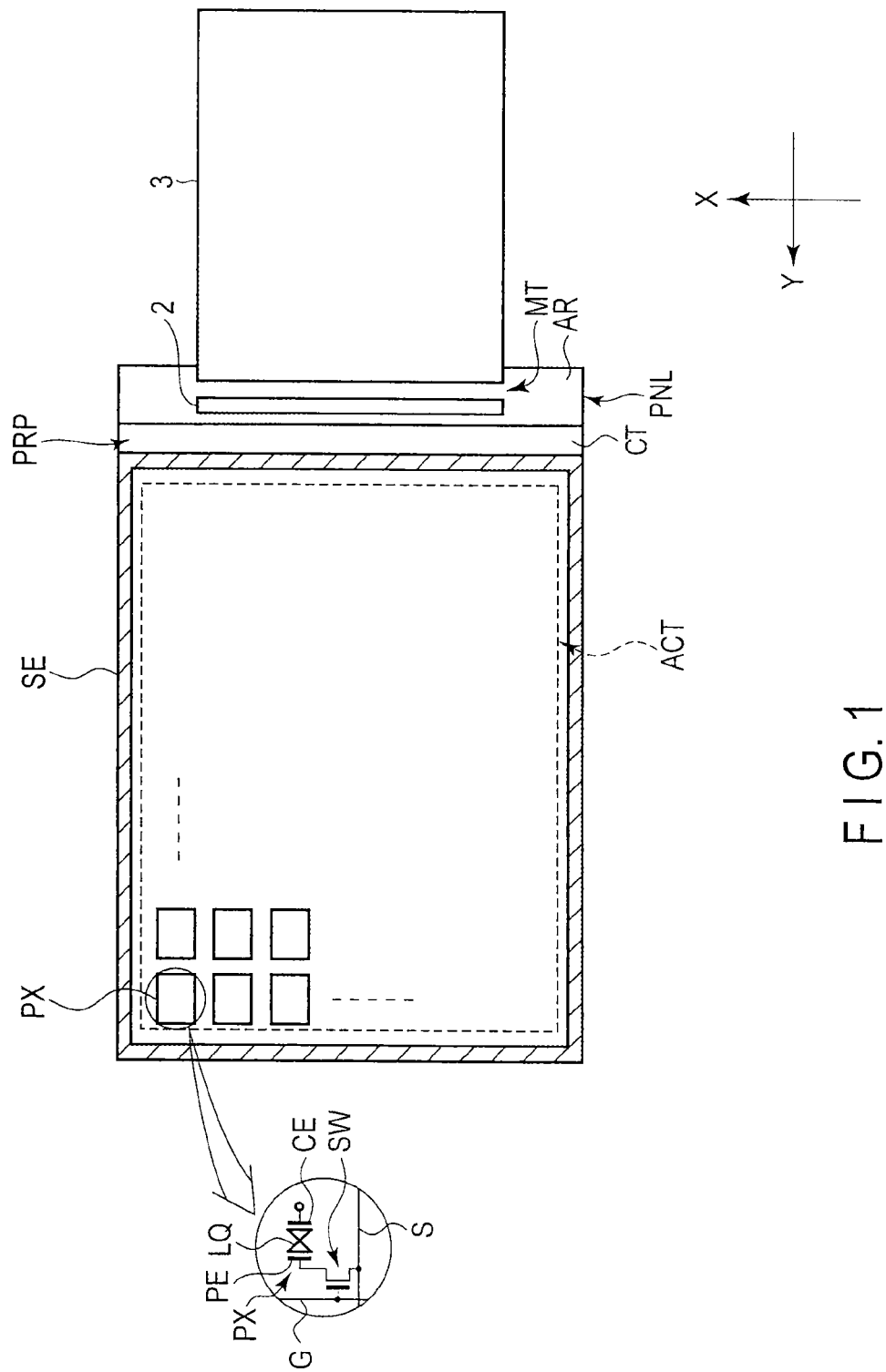
F I G. 1

DISPLAY DEVICE

CROSS-REFERENCE TO RELATED APPLICATIONS

This application is a continuation of U.S. application Ser. No. 15/359,244 filed Nov. 22, 2016, which is a continuation of U.S. application Ser. No. 14/817,921 filed Aug. 4, 2015, which is a continuation of U.S. application Ser. No. 14/560,350 filed on Dec. 4, 2014, and is based upon and claims the benefit of priority from Japanese Patent Application No. 2013-252950, filed Dec. 6, 2013, the entire contents of each of which are incorporated herein by reference.

FIELD

Embodiments described herein relate generally to a display device.

BACKGROUND

Flat-panel display devices have been used in various fields. In such a flat-panel display device, a cell gap between a pair of substrates is held by spacers. In the proximity of a spacer, the alignment of liquid crystal molecules is easily disturbed, and due to this disturbance, inconveniences such as light leakage and the like often occur. Thus, an area overlapping such a spacer should be formed light-tight.

For example, there is a technique proposed in which a first light shield covering an area overlapping a spacer and a second light shield covering an area not overlapping the spacer are used, and an area of the first light shield is set greater than that of the second light shield. With such a technique, a decrease in aperture ratio will be suppressed.

BRIEF DESCRIPTION OF THE DRAWINGS

FIG. 1 is a plan view which schematically shows an example of a display panel PNL applicable to a display device of an embodiment.

DETAILED DESCRIPTION

Figure 2:
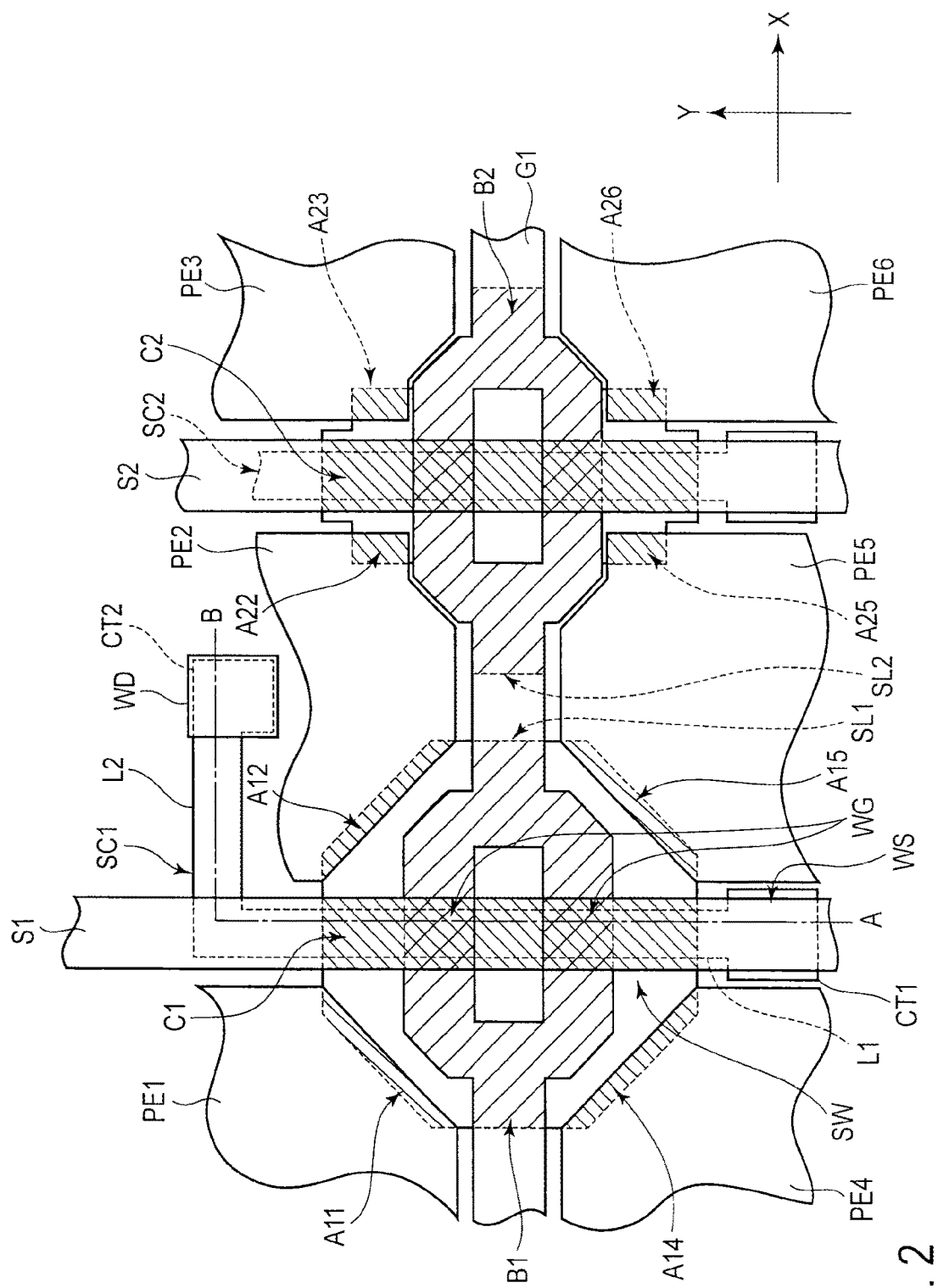
FIG. 2 is a plan view which schematically shows the structure of the display panel PNL of FIG. 1 including a switching element SW.

In general, according to one embodiment, a display device includes: a first substrate including: a first light shielding layer; a second light shielding layer separated from and in a shape different than the first light shielding layer; a first semiconductor layer crossing the first light shielding layer; a second semiconductor layer crossing the second light shielding layer; a gate line extending in a first direction, the gate line opposed to the first light shielding layer to cross the first semiconductor layer and opposed to the second light shielding layer to cross the second semiconductor layer; a first source line extending in a second direction and opposed to the first light shielding layer; a second source line extending in the second direction and opposed to the second light shielding layer; a switching element electrically connected to the gate line and the first source line; and a pixel electrode electrically connected to the switching element and opposed to the first light shielding layer and the second light shielding layer; and a second substrate disposed to be opposed to the first substrate, wherein an area in which the first light shielding layer and the pixel electrode are opposed to each other and an area in which the second light shielding layer and the pixel electrode are opposed to each other are equal in size.

According to another embodiment, a display device includes: a first substrate including: a first insulating substrate; a first light shielding layer disposed on the first insulating substrate; a second light shielding layer disposed on the first insulating substrate, the second light shielding layer separated from and in a shape different than the first light shielding layer; a first insulating film to cover the first light shielding layer and the second light shielding layer; a first semiconductor layer disposed on the first insulating film and to cross the first light shielding layer; a second semiconductor layer disposed on the first insulating film and to cross the second light shielding layer; a second insulating film to cover the first semiconductor layer and the second semiconductor layer; a gate line disposed on the second insulating film extending in a first direction, the gate line opposed to the first light shielding layer to cross the first semiconductor layer and opposed to the second light shielding layer to cross the second semiconductor layer; a third insulating film to cover the gate line; a first source line disposed on the third insulating film to contact one end of the first semiconductor layer, the first source line extending in a second direction and opposed to the first light shielding layer; a drain electrode disposed on the third insulating film to contact the other end of the first semiconductor layer; a second source line disposed on the third insulating film extending in the second direction, the second source line opposed to the second light shielding layer; a fourth insulating film to cover the first source line, the drain electrode, and the second source line; and a pixel electrode disposed on the fourth insulating film to contact the drain electrode, the pixel electrode opposed to the first light shielding layer and the second light shielding layer; and a second substrate disposed to be opposed to the first substrate, wherein an area in which the first light shielding layer and the pixel electrode are opposed to each other and an area in which the second light shielding layer and the pixel electrode are opposed to each other are equal in size.

According to another embodiment, a display device includes: a first substrate including: a first light shielding layer; a second light shielding layer separated from and in a shape different than the first light shielding layer; a gate line extending in a first direction and opposed to the first light shielding layer and the second light shielding layer; a first source line extending in a second direction and opposed to the first light shielding layer; a second source line extending in the second direction and opposed to the second light shielding layer; a first pixel electrode extending in a region divided by the gate line and the first source line and including a first counter-region opposed to the first light shielding layer; a second pixel electrode extending in a region divided by the gate line, the first source line, and the second source line, the second pixel electrode including a second counter-region opposed to the first light shielding layer and a third counter-region opposed to the second light shielding layer; a third pixel electrode extending in a region divided by the gate line and the second source line and including a fourth counter-region opposed to the second light shielding layer; a fourth pixel electrode including a fifth counter-region opposed to the first light shielding layer and the fourth pixel electrode adjacent to the first pixel electrode in the second direction; a fifth pixel electrode including a sixth counter-region opposed to the first light shielding layer and a seventh counter-region opposed to the second light shielding layer, the fifth pixel electrode adjacent to the second pixel electrode in the second direction; and a sixth pixel electrode including an eighth counter-region opposed to the second light shielding layer, the sixth pixel electrode adjacent to the third pixel electrode in the second direction; and a second substrate disposed to be opposed to the first substrate, wherein an area of the second counter-region and an area of the third counter-region are equal in size.

Hereinafter, embodiments are described in detail with reference to accompanying drawings. In the drawings, structural elements having same or similar functions will be referred to by a common reference number and explanation considered redundant will be omitted.

FIG. 1 is a plan view which schematically shows an example of a display panel PNL applicable to a display device of an embodiment.

That is, a display panel PNL is an active matrix liquid crystal display panel including an array substrate AR, counter-substrate CT opposed to the array substrate AR, and a liquid crystal layer LQ held between the array substrate AR and the counter-substrate CT. The array substrate AR and the counter-substrate CT are adhered by a sealant SE while a predetermined cell gap is formed therebetween. In the Figure, the sealant SE is shaped into a rectangular frame-like closed loop. The cell gap is defined by a columnar spacer (described later) formed on the array substrate or the counter-substrate CT. The display panel PNL includes an active area ACT for image display inside the area surrounded by the sealant SE. The active area ACT is shaped into, for example, substantially a rectangular and is composed of a plurality of pixels PX arranged in a matrix.

The array substrate AR includes a gate line G extending in a first direction X, a source line S extending in a second direction Y crossing the first direction X of the gate line G, a switching element SW electrically connected to the gate line G and the source line S, and a pixel electrode PE electrically connected to the switching element SW. A common electrode CE is provided with, for example, the counter-substrate CT to be opposed to each pixel electrode PE via the liquid crystal layer LQ.

The detailed structure of the display panel PNL is not explained here but note that, if the display panel PNL is in a mode in which a vertical field is mainly used such as twisted nematic (TN) mode, optically compensated bend (OCB) mode, and vertical aligned (VA) mode, the pixel electrode PE is provided with the array substrate AR while the common electrode CE is provided with the counter-substrate CT. On the other hand, if the display panel PNL is in a mode in which a transverse field is mainly used such as in-plane switching (IPS) mode and fringe field switching (FFS) mode, both the pixel electrode PE and the common electrode CE are provided with the array substrate AR.

In the example depicted in the Figure, the array substrate AR includes a mount MT extending outside an end of the counter-substrate CT. Signal suppliers such as driving IC chip 2 and flexible printed circuit (FPC) board 3 which supply signals necessary to drive the display panel PNL are positioned in a periphery area PRP outside the active are ACT and mounted on the mount MT.

FIG. 2 is a plan view which schematically shows the structure of the display panel PNL shown in FIG. 1 including the switching element SW.

The array substrate AR includes, for example, a first light shielding layer SL1, second light shielding layer SL2, first gate line G1, first source line S1, second source line S2, switching element SW, and pixel electrode PE. The switching element SW is, for example, a thin-film transistor (TFT). The switching element SW may be either a top gate type or a bottom gate type, and in the example depicted, a top gate type switching element is adopted. The switching element SW is electrically connected to the first gate line G1 and the first source line S1.

The first light shielding layer SL1 and the second light shielding layer SL2 are formed of a light shielding metal material such as molybdenum (Mo) or the like in an island shape, respectively. The second light shielding layer SL2 is separated from and in a shape different than the first light shielding layer SL1. The first light shielding layer SL1 is greater in size than the second light shielding layer SL2, and an area in which the first light shielding layer SL1 is disposed is larger than that of the second light shielding layer SL2. As described later, positions at which columnar spacers are disposed overlap with the first light shielding layers SL1 but do not overlap with the second light shielding layers SL2.

The first semiconductor layer SC1 crosses the first light shielding layer SL1. The first semiconductor layer SC1 includes a contact CT1 at its one end and a contact CT2 at its other end. The first semiconductor layer SC1 is, for example, formed in an L-shape which includes a straight line L1 extending from contact CT1 along the second direction Y and a straight line L2 extending from contact CT2 along the first direction X to connect with the straight line L1. The second semiconductor layer SC2 crosses the second light shielding layer SL2. The second semiconductor layer SC2 is shaped in a similar manner as the first semiconductor layer SC1 and its detailed explanation is thus omitted.

The first gate line G1 extends in the first direction X and is opposed to each of the first light shielding layer SL1 and the second light shielding layer SL2. The first gate line G1 crosses the first semiconductor layer SC1 at the point opposed to the first light shielding layer SL1. Furthermore, the first gate line G1 crosses the second semiconductor layer SC2 at the point opposed to the second light shielding layer SL2. In the example depicted, the switching element SW is of double gate structure, and referring to the switching element SW in particular, the two points of the first gate line G1 crossing the first semiconductor layer SC1 function as gate electrodes WG. Note that, if in a switching element of single gate structure, a gate line crosses a semiconductor layer at a single point.

The first source line S1 and the second source line S2 extend in the second direction Y, respectively. The first source line S1 is opposed to the first light shielding layer SL1. The second source line S2 is opposed to the second light shielding layer SL2. Referring to the switching element SW in particular, the part of the first source line S1 which contacts contact CT1 of the first semiconductor layer SC1 functions as a source electrode WS.

Drain electrode WD of the switching element SW contacts contact CT2 of the first semiconductor layer SC1. Second pixel electrode PE2 at the center of the Figure contacts the drain electrode WD and is electrically connected to the switching element SW.

Now, a positional relationship between the first and second light shielding layers SL1 and SL2 and pixel electrodes PE is explained.

The first light shielding layer SL is disposed such that the crossing point of the first gate line G1 and the first source line S1 is set to its center, and the first light shielding layer SL1 extends into four regions (pixels) divided by the first gate line G1 and the first source line S1. Furthermore, the first light shielding layer SL1 is partly opposed to each of its surrounding four electrodes, namely, first pixel electrode PE1, second pixel electrode PE2, fourth pixel electrode PE4, and fifth pixel electrode PE5. That is, the first light shielding layer SL1 includes a first counter-region A11 opposed to the first pixel electrode PE1, a second counter-region A12 opposed to the second pixel electrode PE2, a fifth counter-region A14 opposed to the fourth pixel electrode PE4, and a sixth counter-region A15 opposed to the fifth pixel electrode PE5.

The second light shielding layer SL2 is disposed such that the crossing point of the first gate line G1 and the second source line S2 is set to its center, and extends into four regions (pixels) divided by the first gate line G1 and the second source line S2. Furthermore, the second light shielding layer SL2 is partly opposed to each of its surrounding four electrodes, namely, second pixel electrode PE2, third pixel electrode PE3, fifth pixel electrode PE5, and sixth pixel electrode PE6. That is, the second light shielding layer SL2 includes a third counter-region A22 opposed to the second pixel electrode PE2, a fourth counter-region A23 opposed to the third pixel electrode PE3, a seventh counter-region A25 opposed to the fifth pixel electrode PE5, and an eighth counter-region A26 opposed to the sixth pixel electrode PE6.

Here, in the first light shielding layer SL1 and the second light shielding layer SL2, the areas opposed to the same pixel electrode are equal in size. Specifically, in the example depicted, the second counter-region A12 of the first light shielding layer SL1 and the third counter-region A22 of the second light shielding layer SL2 both opposed to the second pixel electrode PE2 are equal in size. Or, the sixth counter-region A15 of the first light shielding layer SL1 and the seventh counter-region A25 of the second light shielding layer SL2 both opposed to the fifth pixel electrode PE5 are equal in size. That is, coupling capacitance between the first light shielding layer SL1 and the second pixel electrode PE2 is equal to coupling capacitance between the second light shielding layer SL2 and the second pixel electrode PE2 while coupling capacitance between the first light shielding layer SL1 and the fifth pixel electrode PE5 is equal to coupling capacitance between the second light shielding layer SL2 and the fifth pixel electrode PE5.

In the first light shielding layer SL1, the areas opposed to their respective pixel electrodes are equal in size. In the example depicted, the area of the first counter-region A11 is equal to those of the second counter-region A12, fifth counter-region A14, and sixth counter-region A15. In the second light shielding layer SL2, the areas opposed to their respective pixel electrodes are equal in size. In the example depicted, the area of the third counter-region A22 is equal to those of the fourth counter-region A23, seventh counter-region A25, and eighth counter-region A26. That is, coupling capacitance between the first light shielding layer SL1 and the first pixel electrode PE1 is equal to coupling capacitance between the first light shielding layer SL1 and the second pixel electrode PE2, to coupling capacitance between the first light shielding layer SL1 and the second pixel electrode PE2, to coupling capacitance between the first light shielding layer SL1 and the fourth pixel electrode PE4, and to coupling capacitance between the first light shielding layer SL1 and the fifth pixel electrode PE5. Furthermore, coupling capacitance between the second light shielding layer SL2 and the second pixel electrode PE2 is equal to coupling capacitance between the second light shielding layer SL2 and the third pixel electrode PE3, to coupling capacitance between the second light shielding layer SL2 and the fifth pixel electrode PE5, and to coupling capacitance between the second light shielding layer SL2 and the sixth pixel electrode PE6.

Now, a positional relationship between the first and second light shielding layers SL1 and SL2 and first gate line G1 is explained.

The first light shielding layer SL1 includes an area B1 opposed to the first gate line G1. The second light shielding layer SL2 includes an area B2 opposed to the first gate line G1. Here, in the first light shielding layer SL1 and the second light shielding layer SL2, the areas opposed to the same gate line are equal in size. In the example depicted, the area B1 and the area B2 are equal in size. That is, coupling capacitance between the first light shielding layer SL and the first gate line G1 is equal to coupling capacitance between the second light shielding layer SL2 and the first gate line G1.

Now, a positional relationship between the first and second light shielding layers SL1 and SL2 and first and second source lines S1 and S2 is explained.

The first light shielding layer SL1 includes an area C1 opposed to the first source line S1. The second light shielding layer SL2 includes an area C2 opposed to the second source line S2. Here, in the first light shielding layer SL1 and the second light shielding layer SL2, the areas opposed to their respective source lines are equal in size. In the example depicted, the area C1 and the area C2 are equal in size. That is, coupling capacitance between the first light shielding layer SL1 and the first source line S1 is equal to coupling capacitance between the second light shielding layer SL2 and the second source line S2.

Figure 3:
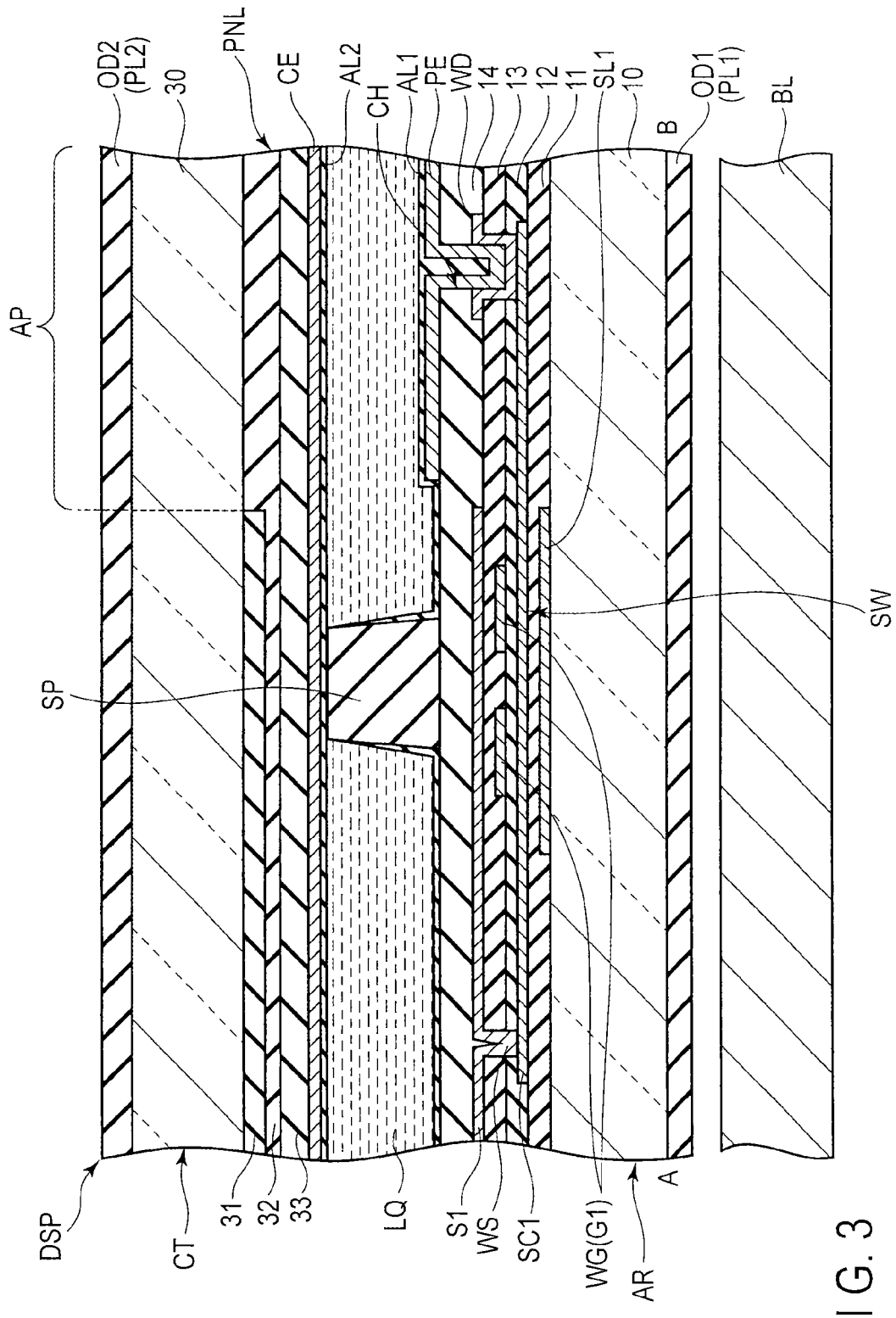
FIG. 3 is a view which schematically shows a cross-sectional structure taken along line A-B of the display device DSP including the switching element SW of FIG. 2.

FIG. 3 is a view which schematically shows a cross-sectional structure taken along line A-B of a display device DSP including the switching element SW pf FIG. 2. Note that, in this example, the cross-sectional structure of the display device DSP in a mode in which a vertical field is mainly used is explained for instance.

First insulating substrate 10 used in the array substrate AR is a transparent substrate such as glass substrate, resin substrate, or the like. The array substrate AR includes, at its side opposed to the counter-substrate CT of the first insulating substrate 10, a light shielding layer SL1, switching element SW, pixel electrode PE, first insulating film 11, second insulating film 12, third insulating film 13, fourth insulating film 14, first alignment film AL1, and the like.

Light shielding layer SL1 is formed on the first insulating substrate 10. The light shielding layer SL1 is covered with the first insulating film 11. The first insulating film 11 is also disposed on the first insulating substrate 10.

The switching element SW includes the first semiconductor layer SC1 disposed on the first insulating film 11. The first semiconductor layer SC1 is formed of, for example, polycrystalline silicon. The first semiconductor layer SC1 is covered with the second insulating film 12. The second insulating film 12 is also disposed on the first insulating film 11.

Gate electrode WG of the switching element SW is formed on the second insulating film 12 and is positioned immediately above the first semiconductor layer SC1. The gate electrode WG is formed integrally with the first gate line G1. Both the gate electrode WG and the first gate line G1 are covered with the third insulating film 13. The third insulating film 13 is also disposed on the second insulating film 12.

First source line S1, and source electrode WS and drain electrode WD of the switching element SW are formed on the third insulating film 13. The source electrode WS is formed integrally with the first source line S1. The drain electrode WD is separated from the first source line S1. The source electrode WS and the drain electrode WD contact the first semiconductor layer SC1, respectively, through contact holes passing through the second insulating film 12 and the third insulating film 13. The source electrode WS, first source line S1 and drain electrode WD are covered with the fourth insulating film 14. The fourth insulating film 14 is also disposed on the third insulating film 13. A contact hole CH is formed in the fourth insulating film 14 reaching the drain electrode WD. The fourth insulating film 14 is formed of, for example, a transparent resin material.

The pixel electrode PE is formed on the fourth insulating film 14. The pixel electrode PE contacts the drain electrode WD through the contact hole CH. The pixel electrode PE is formed of a transparent conductive material such as indium tin oxide (ITO) or indium zinc oxide (IZO). The pixel electrode PE is covered with the first alignment film AL1.

On the other hand, the counter-substrate CT is formed of a second insulating substrate 30 which is a transparent substrate such as glass substrate and resin substrate. The counter-substrate CT includes, at its side opposed to the array substrate AR of the second insulating substrate 30, a light shielding layer (black matrix) 31, color filter (including red color filter layer, green color filter layer, and blue color filter layer) 32, overcoat layer 33, common electrode CE, and second alignment film AL2, and the like.

Light shielding layer 31 is formed on the second insulating substrate 30 at its side opposed to the array substrate AR. The light shielding layer 31 defines each pixel PX in the active area ACT and an aperture AP. The light shielding layer 31 is opposed to the lines provided with the array substrate AR such as gate line G, source line S, and switching element SW.

A color filter 32 is formed in the aperture AP and extends on the light shielding layer 31. The color filter 32 is composed of resin materials each colored differently in, for example, the primary colors of red, green and blue. A red color filter layer is disposed on a red pixel, a green color filter layer is disposed on a green pixel, and a blue color filter layer is disposed on a blue pixel. The boundaries between different color filters overlap the light shielding layer 31.

Overcoat layer 33 covers the color filter 32. The overcoat layer 33 flattens the asperity on the surfaces of the light shielding layer 31 and the color filter 32. The overcoat layer 33 is formed of a transparent resin material.

The common electrode CE is formed on the overcoat layer 33 at its side opposed to the array substrate AR and is opposed to the pixel electrode PE. The common electrode CE is formed of a transparent conductive material such as ITO or IZO. The common electrode CE is covered with the second alignment film AL2.

In the structure described above, the array substrate AR and the counter-substrate CT are arranged such that the first alignment film AL1 and the second alignment film AL2 face each other. At that time, a columnar spacer SP intervenes between the array substrate AR and the counter-substrate CT to create a predetermined cell gap. In the example depicted, the columnar spacer SP is provided with the array substrate AR and is formed on the fourth insulating film 14 in the area overlapping the light shielding layer SL1; however, the columnar spacer SP may be provided with the counter-substrate CT. The array substrate AR and the counter-substrate CT are adhered by a sealant while the cell gap is formed therebetween. Liquid crystal layer LQ is constituted of a liquid crystal composition containing liquid crystal molecules sealed inside the cell gap created between the first alignment film AL1 and the second alignment film AL2.

On the outer surface 10B of the first insulating substrate 10, a first optical device OD1 including a first polarizing plate PL1 is arranged. On the outer surface 30B of the second insulating substrate 30, a second optical device OD2 including a second polarizing plate PL2 is arranged.

In the display panel PNL with the above structure, a backlight unit BL is arranged at its rear surface side. Various models of the backlight unit BL can be adopted optionally and its detailed structural explanation is omitted.

In such a display device DSP, capacitance necessary for image display is produced by means of various electrodes and lines, but on the other hand, the area composed of light shielding materials in which such electrodes and lines are disposed is reduced more and more due to recent demands for higher accuracy, higher aperture ratio, wider viewing angle, and higher contrast. Consequently, sufficient capacitance for image display becomes harder to secure. Therefore, capacitance retaining performance needs to be improved while light leakage from the switching element SW is suppressed. Especially, in a switching element SW of top gate structure, light leakage occurs when light from the backlight unit BL positioned at the rear surface side of the switching element SW is irradiated upon the semiconductor layer SC. Considering this point, the light shielding layer SL is arranged between the semiconductor layer SC and the backlight unit BL to suppress the light leakage in the switching element SW and to improve the capacitance retaining performance.

On the other hand, in the display device DSP, the columnar spacer SP is arranged to maintain a cell gap between a pair of substrates. Especially, in a liquid crystal display device, alignment of liquid crystal molecules tends to be disturbed easily in the periphery of the columnar spacer SP. Considering this point, the light shielding layer SL is arranged in the area overlapping the columnar spacer SP to suppress the light leakage due to the alignment disturbance of the liquid crystal molecules and to suppress decrease in contrast ratio.

What should be noted here is the aperture ratio. If light shielding layers SL having the same area are provided with all pixels, the aperture ratio is lowered. Thus, the light shielding layers SL must have different patterns between the area overlapping the columnar spacer and the area not overlapping the columnar spacer. That is, light shielding layers having relatively large area are disposed in the area where columnar spacers are arranged while light shielding layers having relatively small area are disposed in the area where columnar spacers are not arranged for suppressing the decrease of the aperture ratio. In that case, if the light shielding layers SL having different patterns are arranged opposed to the pixel electrode PE, source line S, and gate line G, the coupling capacitance varies due to differences in area between each light shielding layer and the pixel electrode PE, source line S, and gate line G. The varying coupling capacitance disturbs electrical balance and causes display quality deterioration such as flicker and crosstalk.

In this embodiment, referring to a positional relationship between adjacent first and second light shielding layers SL1 and SL2 and a pixel electrode PE, the area in which the first light shielding layer SL1 and the pixel electrode PE are opposed to each other and the area in which the second light shielding layer SL2 and the pixel electrode PE are opposed to each other are equal. In addition, adjacent pixel electrodes are opposed to their respective light shielding layers equally in area. Furthermore, the first light shielding layer SL1 is opposed to each pixel electrode PE equally in area. The second light shielding layer SL2 is opposed to each pixel electrode PE equally in area. Referring to a positional relationship between the first and second light shielding layers SL1 and SL2 and the first gate line G1, the area in which the first light shielding layer SL1 and the first gate line G1 are opposed to each other and the area in which the second light shielding layer SL2 and the first gate line G1 are opposed to each other are equal. Referring to a positional relationship between the first and second light shielding layers SL1 and SL2 and the first and second source lines S1 and S2, the area in which the first light shielding layer SL1 and the first source line S1 are opposed to each other and the area in which the second light shielding layer SL2 and the second source line S2 are opposed to each other are equal. Consequently, in each pixel which is capacitive coupling with the same source line, the occurrence of crosstalk due to different coupling capacitances between the pixel electrode PE and light shielding layer SL can be suppressed. Additionally, in each pixel which is capacitive coupling with the same gate line, the occurrence of flicker due to different coupling capacitances between the gate line G and the light shielding layer SL can be suppressed. Therefore, a display device having good display quality can be produced.

Figure 4:
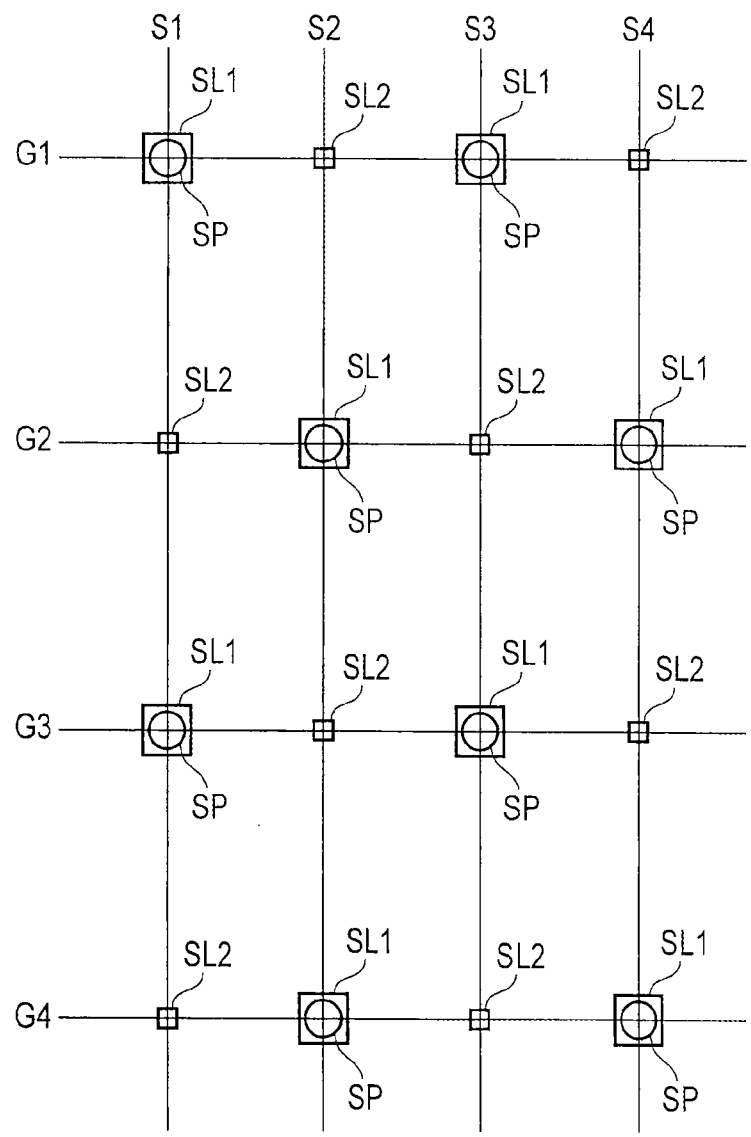
FIG. 4 is a view which schematically shows a layout example of columnar spacers SP and light shielding layers SL.

FIG. 4 is a view which schematically shows a layout example of columnar spacers SP and light shielding layers SL.

Specifically, columnar spacers SP are, as explained above, disposed at certain crossing points of gate lines G and source lines S. Out of the entire crossing points of the gate lines G and source lines S, first light shielding layers SL1 having a relatively large area are disposed only at the crossing points which overlap the columnar spacers SP, and second light shielding layers SL2 having a relatively small area are disposed at the crossing points which do not overlap the columnar spacers SP.

In the present embodiment, the number of the first light shielding layers SL1 disposed on each source line is the same. For example, referring to the first source line S1 to the fourth source line S4 in the Figure, each line has two first light shielding layers SL1 at the crossing points of the source and gate lines. Furthermore, the number of the second light shielding layers SL2 disposed on each of the source lines S1 to S4 is the same. Thus, in each source line S, the first light shielding layers SL1 and the second light shielding layers SL2 have substantially the same coupling capacitance which means that the display quality deterioration due to differences in the coupling capacitance in the source line S can be suppressed.

Similarly, the number of the first light shielding layers SL1 disposed on each gate line is the same. For example, referring to the first gate line G1 to the fourth gate line G4 in the Figure, each line has two first light shielding layers SL1 at the crossing points of the source and gate lines. Furthermore, the number of the second light shielding layers SL2 disposed on each of the gate lines G1 to G4 is the same. Thus, in each gate line G, the first light shielding layers SL and the second light shielding layers SL2 have substantially the same coupling capacitance which means that the display quality deterioration due to differences in the coupling capacitance in the gate line G can be suppressed.

As can be understood from the above, a display device having good display quality can be produced according to the present embodiment.

Note that the invention is not limited to the above-described embodiment alone, and in the materialization process, its structural elements may be modified freely within the scope and spirit of the invention. Furthermore, the invention can be altered in a variety of ways by a suitable combination of the structural elements described in the embodiment. For example, some of the structural elements described in the embodiment may be removed optionally. Or, one or more structural elements of an embodiment may be combined with one or more structural elements of a different embodiment.

In the embodiment, a liquid crystal display device is used as an example of a display device. However, no limitation is intended thereby and the display device may be a self luminescent display device such as an organic electroluminescent display device or a flat-panel display device such as an electronic paper display device including electrophoresis elements or the like. Furthermore, a size of the display device does not matter and the embodiment can be applied to a display device of any size; small, medium, or large.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
a gate line extending in a first direction;
a first source line and a second source line, each extending in a second direction crossing the first direction;
a first electrode disposed between the first source line and the second source line;
a second electrode disposed between the first source line and the second source line, and adjacent to the first electrode in the second direction;
a first light shield disposed in a first intersection of the gate line and the first source line;
a second light shield disposed in a second intersection of the gate line and the second source line; and
a spacer disposed on the first light shield;
wherein the gate line is disposed between the first electrode and the second electrode,
the first light shield includes a first region which is disposed in a first electrode side, is located between the first source line and the gate line, and does not overlap with the gate line, the first source line and the second source line,
the second light shield includes a second region which is disposed in the first electrode side, is located between the second source line and the gate line, and does not overlap with the gate line, the first source line and the second source line, and
a size of the first region is greater than a size of the second region.

2. The display device of claim 1, wherein
the first region includes a third region overlapping with the first electrode,
the second region includes a fourth region overlapping with the first electrode, and a length of the third region along the second direction is greater than that of the fourth region along the second direction.

3. The display device of claim 2, wherein the third region includes an end, and a length from the gate line to the end is greater than that from the gate line to the fourth region.

4. The display device of claim 2, wherein the third region and the fourth region are equal in size.

5. The display device of claim 1, further comprising:
a switching element electrically connected to the first source line and the first electrode; and
wherein the switching element is opposed to the first light shield.

6. The display device of claim 1, wherein
the first light shield includes a fifth region opposed to the gate line,
the second light shield includes a sixth region opposed to the gate line, and
the fifth region and the sixth region are equal in size.

7. The display device of claim 1, wherein
the first light shield includes a seventh region opposed to the first source line,
the second light shield includes an eighth region opposed to the second source line, and
the seventh region and the eighth region are equal in size.

8. The display device of claim 1, wherein
the first light shield and the second light shield are formed of a metal material.

9. The display device of claim 1, wherein
the second light shield has a shape different from the first light shield.

10. The display device of claim 1, further comprising:
a first substrate,
wherein the first light shield, the second light shield, the gate line, the first source line, and the second source line are formed on the first substrate.

11. The display device of claim 1, further comprising:
a first substrate,
wherein the first light shield, the second light shield, and the spacer are formed on the first substrate.

12. The display device of claim 1, wherein a length from the first intersection to the first electrode is greater than a length from the second intersection to the first electrode.

13. A display device comprising:
a gate line extending in a first direction;
a first source line and a second source line, each extending in a second direction crossing the first direction;
a first light shield disposed in an intersection of the gate line and the first source line;
a second light shield disposed in an intersection of the gate line and the second source line; and
a spacer disposed on the first light shield;
wherein the first light shield includes a first region which does not overlap with the gate line, the first source line and the second source line,
the second light shield includes a second region which does not overlap with the gate line, the first source line and the second source line, and
a size of the first region is greater than a size of the second region.

14. The display device of claim 13, wherein
the first light shield includes a third region overlapping with the gate line,
the second light shield includes a fourth region overlapping with the gate line, and
the third region and the fourth region are equal in size.

15. The display device of claim 13, wherein
the first light shield includes a fifth region overlapping with the first source line,
the second light shield includes a sixth region overlapping with the second source line, and
the fifth region and the sixth region are equal in size.

16. The display device of claim 13, further comprising;
a first substrate,
wherein the first light shield, the second light shield, the gate line, the first source line, and the second source line are formed on the first substrate.

17. The display device of claim 13, wherein
the first light shield and the second light shield are formed of a metal material, and
the first light shield is separated from the second light shield.

18. The display device of claim 13, further comprising;
a first substrate,
wherein the first light shield, the second light shield, and the spacer are formed on the first substrate.

* * * * *